United States Patent [19]

Schneider

[11] 4,023,260
[45] May 17, 1977

[54] METHOD OF MANUFACTURING SEMICONDUCTOR DIODES FOR USE IN MILLIMETER-WAVE CIRCUITS

[75] Inventor: Martin Victor Schneider, Holmdel, N.J.

[73] Assignee: Bell Telephone Laboratories, Incorporated, Murray Hill, N.J.

[22] Filed: Mar. 5, 1976

[21] Appl. No.: 664,269

[52] U.S. Cl. .................................. 29/578; 29/583; 29/590; 29/591; 156/645; 156/659; 357/55; 357/65

[51] Int. Cl.² ................. B01J 17/00; H01L 21/302

[58] Field of Search ............. 156/5, 6, 17, 13; 148/175, 177; 29/580, 583, 590, 591, 582, 578; 51/283; 357/89, 55, 65; 427/88; 96/36

[56] References Cited

UNITED STATES PATENTS

| | | | |
|---|---|---|---|
| 3,151,007 | 9/1964 | Dahlberg | 148/177 |
| 3,423,823 | 1/1969 | Ansley | 29/578 |
| 3,670,404 | 6/1972 | Kamoshida | 29/580 |
| 3,680,205 | 8/1972 | Kravitz | 156/17 |
| 3,775,200 | 11/1973 | de Nobel et al. | 156/17 |
| 3,781,975 | 1/1974 | Ressel et al. | 29/583 |
| 3,897,627 | 8/1975 | Klatskin | 29/578 |
| 3,962,713 | 6/1976 | Kendau et al. | 357/55 |
| 3,972,113 | 8/1976 | Nakata et al. | 29/583 |

*Primary Examiner*—Douglas J. Drummond
*Assistant Examiner*—Jerome W. Massie
*Attorney, Agent, or Firm*—Daniel D. Dubosky

[57] ABSTRACT

A new method of manufacturing semiconductor diodes is described in which the resulting diode chips have ohmic contacts on the four side surfaces of the diode chip. An insulating layer of a material such as silicon-dioxide is first formed on the epitaxial layer of a semiconductor wafer. Notches are then cut in a gridlike pattern into the semiconductor wafer on the side of the chip having the insulating layer. The notches extend approximately halfway into the semiconductor wafer and form a plurality of areas, each one of which has the dimensions of a desired diode chip. An ohmic contact is then established on the walls and bottoms of the notches by depositing a metallic layer and alloying this layer to the semiconductor material. A plurality of diodes are formed in holes in the insulating layer on each one of the areas representing an individual chip. The semiconductor wafer is then backlapped to remove the remaining material connecting the individual chips together thereby forming a plurality of individual diode chips.

5 Claims, 8 Drawing Figures

METHOD OF MANUFACTURING SEMICONDUCTOR DIODES FOR USE IN MILLIMETER-WAVE CIRCUITS

BACKGROUND OF THE INVENTION

Millimeter-wave integrated circuits are being increasingly used for communication and scientific purposes because of their many desirable properties. In these millimeter-wave integrated circuits metallic conductors are established on an insulating substrate by the process of photolithography and semiconductor devices are then mounted on these conductors. One difficulty with the use of millimeter-wave integrated circuits at very short wavelengths is the lack of a satisfactory method of mounting the semiconductor devices on the circuits.

In order to utilize fully the high frequency performance characteristics of millimeter-wave semiconductor diodes these diodes must be mounted in the circuit in a way which introduces a minimum amount of parasitic reactance. The waveguide mount known in the prior art as the Sharpless wafer is one of the closest approximations to a optimum configuration of the device. This type of semiconductor diode is disclosed in the article entitled, "Wafer-Type Millimeter Wave Rectifier" by W. M. Sharpless, *Bell System Technical Journal*, Vol. 35, 1956, pp. 1385–1402. The Sharpless type of semiconductor diode has a rectifying contact on one surface of a semiconductor chip and an ohmic contact on the opposite surface of the chip. This type of diode chip can be mounted in a waveguide with the ohmic contact attached to one wall of the waveguide and contact is established to the opposite surface of the chip by means of a spring coming from the opposite wall of the waveguide. Because this spring contact is perpendicular to the diode face, stray capacitance across the diode is minimized. Series inductance is minimized by making the spring as short as possible.

It is possible to mount the Sharpless wafer in the stripline geometry of a millimeter-wave integrated circuit. FIG. 1 of the drawings shows a directly adapted version of the prior art waveguide mounting in which the same type of diode chip is mounted in a millimeter-wave integrated circuit. The chip designated as 100 in FIG. 1 is cut small enough to meet the dimensional requirements of the stripline. It is mounted to the stripline by being set on its side and soldering the ohmic contact on its back surface 110 to a conductor 101 on a ceramic or glass substrate 105 in the millimeter-wave integrated circuit. Since the chip 100 only has an ohmic contact on its back surface, when set on its side as shown in FIG. 1, the solder which holds this chip to the stripline conductor assumes the shape of a fillet 102. A metallic spring 103 is mounted on a second conductor 104 and the pointed edge of the spring is positioned so as to contact a rectifying contact on chip 100.

The semiconductor diode chips of the prior art have a gold contact suitable for soldering only on the back surface of the chip because the sequence of processes required to make millimeter-wave Schottky barrier diodes requires that the ohmic contact be alloyed to the back of the semiconductor wafer before the diodes are formed on the front surface of the wafer. The ohmic contact must be made first otherwise the alloying step required to diffuse the contact into the semiconductor would destroy the diodes on the front surface as well. After the diodes are formed on the front surface the wafer is sawed into chips with the desired dimensions. It is not feasible technically or economically to cut the wafer first and process the chips individually. Two problems are confronted with the configurations shown in FIG. 1. First, the solder bond between the chip and stripline conductor must be a fillet joint because the sides of the chip are not able to be soldered. This joint is difficult to accomplish and is mechanically unreliable. Second, the small chip size required for millimeter-wave circuits is difficult to achieve since the epitaxial layer is susceptible to damage during the final process of sawing the wafer into chips. Such damage can extend about 0.001 to 0.002 inches from the edge of a cut and a minimum chip size is set by the need to have an undamaged area in the center of the chip.

The above-mentioned problems have been overcome by the use of an invention described in my copending application with Messrs. E. R. Carlson and A. A. Penzias filed simultaneously herewith. In accordance with this invention in my copending application, the back surface of a semiconductor wafer is first notched by a series of saw cuts spaced so as to section the wafer into individual areas corresponding to the chips but these cuts only extend approximately halfway into the wafer. After notching the back surface, the ohmic contact is established by depositing and alloying a metal contact on the back surface of the semiconductor wafer including the sides of the notches. Rectifying contact are then established on the front of the semiconductor wafer by a normal process. After establishing the diodes on the front surface the wafer is then broken along the fracture lines generally following the saw cuts produced during the notching process. The resulting notch-back chip can then be soldered into a millimeter-wave integrated circuit with solder adhering both to the bottom and along three edges of the chip yielding excellent mechanical and electrical results.

Although utilization of the invention in my copending application results in semiconductor diodes which are applicable to millimeter-wave thin-film circuits, the yield produced by this invention is not as high as desired since the breaking process is somewhat unpredictable and some of the chips produced have much different electrical and physical characteristics due to their irregular shape. Accordingly, it would be desirable to have a process for manufacturing semiconductor diodes of this type which would result in a higher yield of uniform semiconductor diodes.

SUMMARY OF THE INVENTION

A higher yield of electrically and mechanically uniform semiconductor diodes is achieved in accordance with the present invention wherein notches are cut into the top surface on which an insulating layer such as silicon-dioxide has been first formed over an epitaxial layer of the wafer. The notches extend into the wafer to a depth of approximately one-half the thickness of the semiconductor wafer and these notches are cut in a grid-like pattern to form a plurality of areas, each one of which has the desired dimensions of an individual diode chip. An ohmic contact is then established on the walls and bottoms of the notches by depositing a metallic layer such as tin, nickel and gold and alloying this layer to the semiconductor material. A plurality of diodes are then fabricated on each of the chip areas in the grid-like pattern. The individual diode chips are then separated by backlapping the semiconductor wafer so as to remove the semiconductor material connecting the individual areas together.

BRIEF DESCRIPTION OF THE DRAWING

The invention will be more readily understood after reading the following detailed description in conjunction with the drawings wherein.

DETAILED DESCRIPTION

Figure 1:
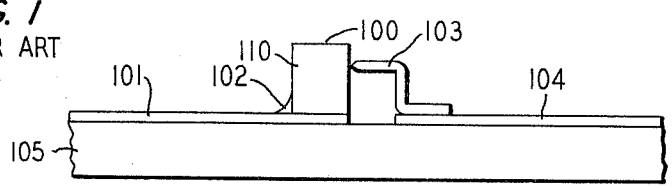
FIG. 1 is a pictorial representation of a millimeter-wave integrated circuit using a prior art type diode.
Figure 2:
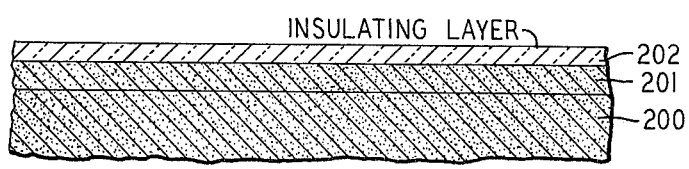
FIG. 2 is a cross-sectional represenatation of the top surface of a semiconductor wafer used in the present process.

A cross-sectional view of the top surface of a semiconductor wafer that is used in the present process is shown in FIG. 2. As illustrated in FIG. 2 a semiconductor material 200 such as silicon or gallium arsenide is topped with an epitaxial layer 201, and this layer is covered with a silicon-dioxide layer 202. The silicon-dioxide layer can be established on a typical semiconductor wafer by vapor phase deposition.

Figure 3:
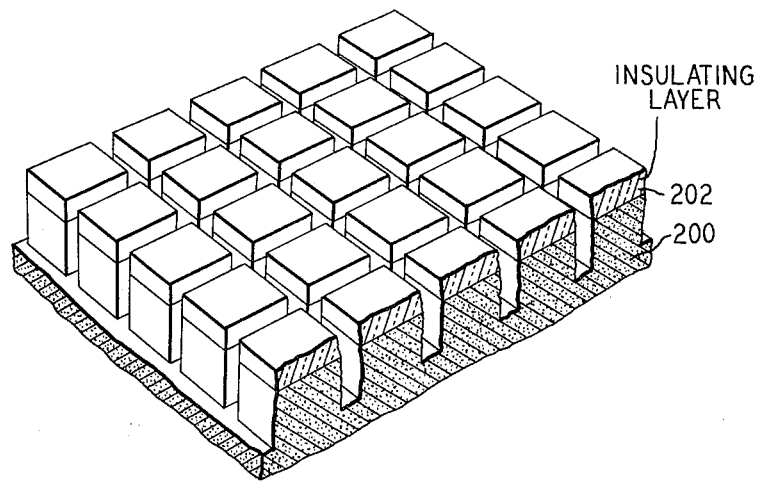
FIG. 3 is a pictorial cross-sectional representation of the semiconductor wafer after the top surface of the wafer has been notched in a grid-like pattern.

Using a diamond saw, notches are cut through the silicon-dioxide layer in the top surface of the semiconductor wafer is a grid-like pattern thereby sectioning the semiconductor wafer into areas having the desired dimensions of the diode chips being manufactured. A pictorial cross-sectional representation of the semiconductor wafer after the notches are cut to a depth of approximately one-half of the thickness of the semiconductor slice is shown in FIG. 3. As further indicated in FIG. 3, these notches create side surfaces that are substantially flat and perpendicular to the top surface of the semiconductor wafer. The depth of the silicon-dioxide layer illustrated in FIG. 3 has been exaggerated in size relative to the depth of the notches for the purpose of illustrating the silicon-dioxide layer.

Figure 4:
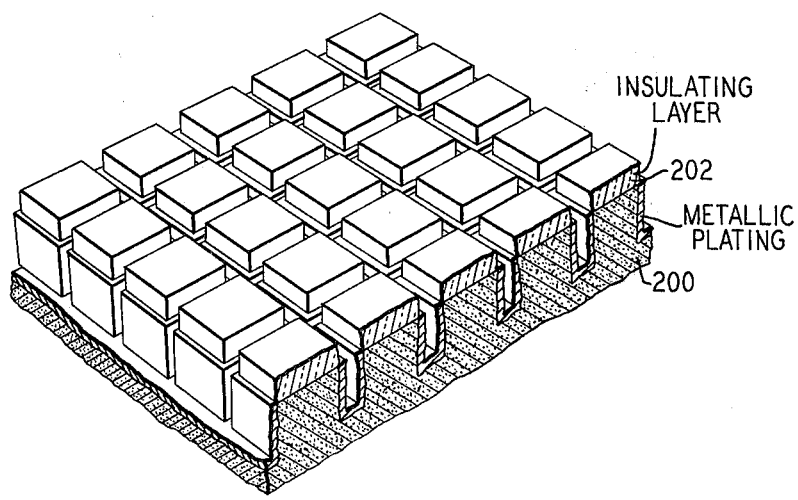
FIG. 4 is a pictorial cross-sectional representation of the semiconductor wafer after an ohmic contact has been established on the surfaces of the semiconductor wafer exposed by the notching process.

After the notches have been cut in the top surface the notched side of the semiconductor wafer is plated with a conducting material such as tin, nickel and gold by depositing the metals through a process of electroplating. Since silicon-dioxide layer is a non-conducting material, it is not plated with the metal and only areas of the semiconductor wafer exposed by the notching step including the walls and floors of the notches are coated during the plating process. The entire semiconductor wafer is then heated in order to alloy the metal layers to the semiconductor material thereby forming a good ohmic contact. The resulting semiconductor wafer with the plated notches is illustrated in FIG. 4. Here again the thickness of the plating 400 is exaggerated relative to the size of each of the individual chip areas for the purpose of illustrating the presence of the plating.

After the plating process the remaining silicon-dioxide layer on the top surface of the semiconductor wafer is coated with a negative photoresist material. This photoresist material on the front surface of the wafer is then exposed to ultraviolet light through a mask having a plurality of closely spaced black dots. The size of each dot is caused to be equal to the diameter of the rectifying contact to be established with the epitaxial layer. The dots are closely spaced in a pattern such that a pluraltiy of dots exist on each area of the top or front face of the wafer corresponding to a single area defined by the walls of the notches. After exposure the photoresist material is then developed. All areas of the photoresist material that have been exposed to ultraviolet light become hard during the developing process. In the present process where black dots have been present on the mask, the areas under the black dots have not been exposed to ultraviolet light and the photoresist material in these areas are washed away using an appropriate solvent. To insure removal of all the solvent the semiconductor wafer is then baked.

After the unexposed photoresist material has been removed by the solvent the semiconductor wafer is left with a plurality of holes in the hardened photoresist material with the silicon-dioxide layer exposed in the holes. A suitable etching solution such as buffered hydroflouric acid is then utilized to etch away the exposed silicon-dioxide layer down to the epitaxial layer of the semiconductor wafer. The remaining photoresist is then dissolved by using a stripper or a plasma strip in an oxygen atmosphere. This remaining photoresist material may also be removed through a mechanical process utilizing abrasion.

Figure 5:
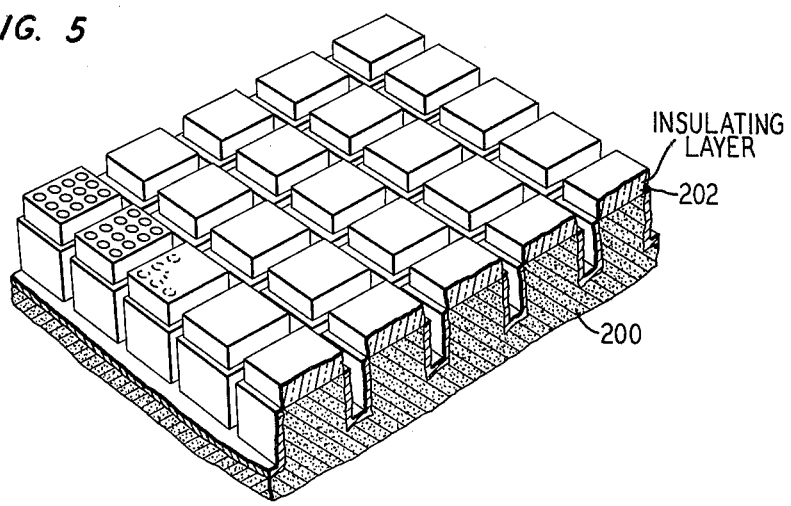
FIG. 5 is a pictorial cross-sectional representation of the semiconductor wafer after Schottky-barrier diodes have been established on the top surfaces of the wafer.

After the photoresist material has been entirely removed a good conducting material such as platinum is then deposited in the holes of the silicon-dioxide layer by using a process of electroplating or evaporation. After this metallic plating in the process there is no need to heat in order to alloy because this conductive material in the holes of the silicon-dioxide layer has been placed in contact with the epitaxial layer for the purpose of establishing a rectifying contact of the type known in the art as a Schottky-barrier contact. At this point in the process each individual chip area of the semiconductor wafer has its front or top surface covering with a plurality of rectifying contacts as illustrated in FIG. 5.

Figure 6:
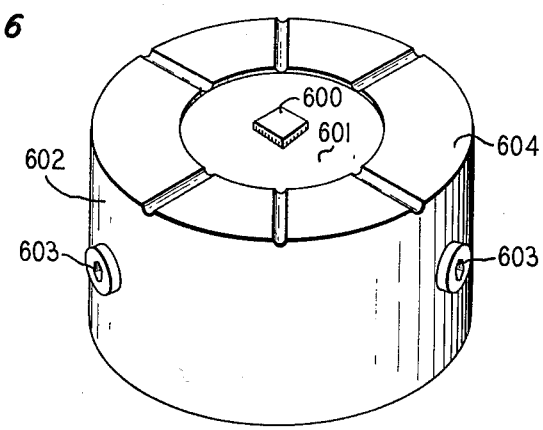
FIG. 6 is a pictorial representation of the semiconductor wafer mounted on a lapping block of the type utilized in the present invention to separate the wafer into individual diode chips.

The semiconductor wafer is then separated into individual chips by backlapping the wafer to remove the semiconductor material on the bottom or back surface of the wafer that continues to bind the individual chips together. To accomplish this backlapping step in the process, the semiconductor wafer (designated as 600 in FIG. 6) is adhered to the center cylinder 601 of a lapping block by using paraffin or wax as the adhesive with the notched side of the wafer in proximate relationship to the surface of the inner cylinder. This center cylinder 601 is adjustable with respect to an outer cylinder 602 of the lapping block and the position of the inner to outer cylinder can be locked by set screws 603 in the outer cylinder 602. By means of a dial indicator guage, the center cylinder is locked in a position such that the bottom surface of the wafer protrudes beyond the plane defined by the top surface 604 of the outer cylinder 602 by a small amount such as 0.001 inch. The entire lapping block is then taken in hand and this small amount of approximately 0.001 inch is then removed from the wafer by rubbing the wafer in a lapping compound on a flat glass surface in much the same way that one skilled in the art would grind a lens. In this way small amounts of the semiconductor material are removed in steps from the bottom surface of the wafer until the entire semiconductor material that binds the individual chips together is removed. A lapping compound having particle sizes of about 9.5 microns has been found to be especially suitable for this purpose. After the semiconductor wafer has been backlapped to the floors or bottoms of the notches, the individual chips can be recovered from the lapping block by dissolving the paraffin or wax in a suitable solvent.

Figure 7:
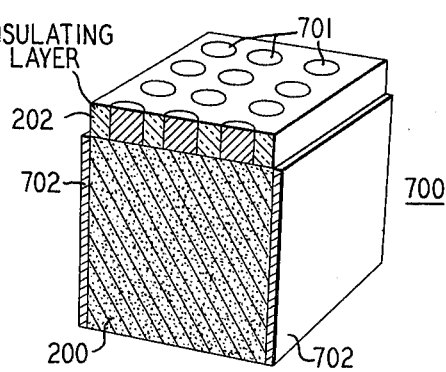
FIG. 7 is a pictorial cross-sectional representation of a single semiconductor diode after the wafer has been separated into a plurality of individual chips by back-lapping the water to the bottoms of the notches.
Figure 8:
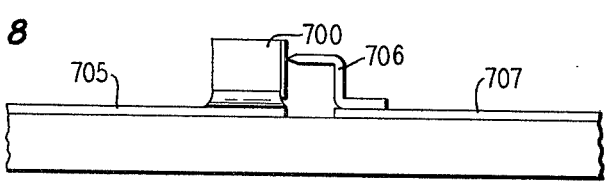
FIG. 8 is a pictorial representation of a thin-film stripline on which a diode constructed in accordance with the present invention has been mounted.

A cross-sectional view of one individual chip that is created by the backlapping step in the process is illustrated in FIG. 7. As illustrated in FIG. 7 this single chip 700 has a plurality of rectifying contacts designated as 701 in FIG. 7, and the side surfaces of the chip are coated with an ohmic contact designated as 702 in FIG. 7. This individual chip 700 may now be mounted in a millimeter-wave thin-film integrated circuit in a fashion illustrated in FIG. 8. As further indicated in FIG. 7, the side surfaces created by the notching process, which side surfaces are substantially flat and perpendicular to the top surface of the semiconductor wafer, permit the resulting individual chip to be mounted to the thin-film with the top surface of the chip substantially perpendicular to the thin-film stripline 705. As indicated in FIG. 8 the individual chip is mounted on the thin film by soldering three of the four sides to the conducting stripline 705. As in the case of the prior art diode a spring member 706 is mounted to a second stripline 707 and this spring member is positioned so as to establish a pointed contact with one of the rectifying contact 701 on the top side of the individual chip. As a result of this type of mounting made possible by having ohmic contacts on the side surfaces of the chip, the joint established between the chip and the stripline in FIG. 8 is more mechanically and electrically stable than the joint created with prior art diodes.

The foregoing is a description of a specific process that can be utilized to practice the present invention. Numerous modifications may be made by those skilled in the art without departing from the spirit and scope of the present invention.

What is claimed is:

1. A method of manufacturing millimeter-wave semiconductor diodes from a semiconductor wafer having a epitaxial layer and an insulating layer on the top surface of the wafer comprising the steps of notching said top surface of the semiconductor wafer in a grid-like pattern with the notches extending to a depth of approximately one-half the thickness of the semiconductor wafer thereby creating side-surfaces in said wafer which are substantially flat and perpendicular to the top surface of said wafer, plating the surfaces of semiconductor material exposed by said notching step with a conductive material, heating the semiconductor wafer to alloy the conductive material to the semiconductor material surfaces, fabricating a plurality of diodes on the remaining top surface of the semiconductor wafer that is not cut away by the notching step with at least one diode for each of the areas created by said grid-like pattern at a point in time subsequent to heating the semiconductor wafer and thereafter lapping the bottom surface of the semiconductor wafer in order to create a plurality of individual chips.

2. A process as defined in claim 1 for manufacturing semiconductor diodes wherein the step of fabricating a plurality of diodes includes the steps of creating holes in the insulating layer remaining after the notching step in order to expose the epitaxial layer in a plurality of locations in each of the areas created by said grid-like pattern, and depositing a conductive metal in the holes of said insulating layer in order to create rectifying contacts with said epitaxial layer.

3. A method for manufacturing semiconductor diodes as defined in claim 2 wherein the step of creating holes in said insulating layer includes the steps of coating the insulating layer with a photoresist meterial, exposing said photoresist material to suitable radiation through a mask having a plurality of darkened areas, developing said photoresist material, and dissolving the unexposed photoresist with a suitable solvent.

4. A method of manufacturing millimeter-wave semiconductor diodes from a semiconductor wafer having a bottom surface and a top surface with an epitaxial layer comprising the steps of depositing an insulating layer on the top surface of said semiconductor wafer, cutting notches in the top surface of said semiconductor wafer in a grid-like pattern to a depth of approximately one-half the thickness of the semiconductor wafer thereby sectioning the semiconductor wafer into a plurality of areas each one which corresponds to an individual, unseparated chip having side surfaces that are substantially flat and perpendicular to the top surface of said wafer, plating the semiconductor material exposed by said notches with a metallic conductor, heating the semiconductor wafer so as to alloy the metal plating to the semiconductor material, fabricating diodes on the remaining top surface of said semiconductor wafer, at a point in time subsequent to heating the semiconductor wafer and thereafter lapping the back surface of the semiconductor wafer so as to separate the wafer into individual chips.

5. A method of manufacturing semiconductor diodes as defined in claim 4 wherein the step of fabricating diodes on the remaining top surface includes the steps of coating the insulating layer remaining after the notching step with a photoresist material, exposing said photoresist material to suitable radiation through a mask having a plurality of darkened areas, developing said photoresist material, dissolving the unexposed photoresist material so as to expose a plurality of areas on said remaining insulating layer, etching the exposed silicon dioxide layer to expose a pluraltiy of areas on said epitaxial layer, and depositing a metallic conductor on the areas of exposed epitaxial layer.

* * * * *